US007923313B1

(12) United States Patent
Tutt et al.

(10) Patent No.: US 7,923,313 B1

(45) Date of Patent: Apr. 12, 2011

(54) METHOD OF MAKING TRANSISTOR INCLUDING REENTRANT PROFILE

(75) Inventors: Lee W. Tutt, Webster, NY (US); Shelby F. Nelson, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/713,252

(22) Filed: Feb. 26, 2010

(51) Int. Cl.
*H01L 21/00* (2006.01)

(52) U.S. Cl. .......................................... 438/156; 257/57

(58) Field of Classification Search .................. 438/156
See application file for complete search history.

(56) References Cited

U.S. PATENT DOCUMENTS

| | | | |
|---|---|---|---|
| 5,641,694 | A | 6/1997 | Kenney |
| 6,972,461 | B1 | 12/2005 | Chen et al. |
| 7,413,982 | B2 | 8/2008 | Levy |
| 7,456,429 | B2 | 11/2008 | Levy |
| 7,571,529 | B2 | 8/2009 | Sirringhaus et al. |
| 7,586,130 | B2 | 9/2009 | Kawashima et al. |
| 7,592,218 | B2 | 9/2009 | Brown |
| 7,629,633 | B2 | 12/2009 | Chan et al. |
| 2005/0164464 | A1 | 7/2005 | Hecht et al. |
| 2007/0131998 | A1 | 6/2007 | Lin et al. |
| 2008/0149913 | A1 | 6/2008 | Tanaka et al. |
| 2008/0166884 | A1 | 7/2008 | Nelson et al. |
| 2009/0001470 | A1 | 1/2009 | Anderson et al. |
| 2009/0032803 | A1 * | 2/2009 | Appenzeller et al. ........... 257/24 |
| 2009/0130858 | A1 | 5/2009 | Levy |
| 2009/0166725 | A1 | 7/2009 | Lee |

FOREIGN PATENT DOCUMENTS

| | | |
|---|---|---|
| JP | 63-170971 | 7/1988 |
| JP | 05-144744 | 6/1993 |
| JP | 2005-203395 | 7/2005 |
| JP | 2007-284766 | 11/2007 |
| JP | 2008-103636 | 5/2008 |
| KR | 2009-0017045 | 2/2009 |
| KR | 2009-0017046 | 2/2009 |
| WO | WO 89/05516 | 6/1989 |

* cited by examiner

*Primary Examiner* — Thao X Le
*Assistant Examiner* — Kimberly Trice
(74) *Attorney, Agent, or Firm* — William R. Zimmerli

(57) ABSTRACT

A method of manufacturing a transistor includes providing a substrate including in order an electrically conductive material layer and an electrically insulating material layer; depositing a resist material layer over the electrically insulating material layer; patterning the resist material layer to expose a portion of the electrically insulating material layer; removing the exposed electrically insulating material layer to expose a portion of the electrically conductive material layer; removing the exposed electrically conductive material layer to create a reentrant profile in the electrically conductive material layer and the electrically insulating material layer; conformally coating the substrate and the exposed material layers with a second electrically insulating material layer; conformally coating the second electrically insulating material layer with a semiconductor material layer; and directionally depositing an electrically conductive material layer over the semiconductor material layer.

5 Claims, 5 Drawing Sheets

100
170
130
120
110
150

100
170
130
120
110
160
150

100
170
130
120
110
160
150

METHOD OF MAKING TRANSISTOR INCLUDING REENTRANT PROFILE

CROSS REFERENCE TO RELATED APPLICATIONS

Reference is made to commonly-assigned, U.S. patent application Ser. No. 12/713,252, entitled "TRANSISTOR INCLUDING REENTRANT PROFILE" filed concurrently herewith.

FIELD OF THE INVENTION

This invention relates generally to semiconductor devices, and in particular to transistor devices.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

As such, there is an ongoing need to provide semiconductor device architectures that include patterned vertical or inclined device surfaces. There is also an ongoing need to provide manufacturing techniques capable of processing small device features of semiconductor devices without requiring high resolution alignment tolerances.

SUMMARY OF THE INVENTION

According to an aspect of the present invention; a method of manufacturing a transistor includes providing a substrate including in order an electrically conductive material layer and an electrically insulating material layer; depositing a resist material layer over the electrically insulating material layer; patterning the resist material layer to expose a portion of the electrically insulating material layer; removing the exposed electrically insulating material layer to expose a portion of the electrically conductive material layer; removing the exposed electrically conductive material layer to create a reentrant profile in the electrically conductive material layer and the electrically insulating material layer; conformally coating the substrate and the exposed material layers with a second electrically insulating material layer; conformally coating the second electrically insulating material layer with a semiconductor material layer; and directionally depositing an electrically conductive material layer over the semiconductor material layer.

According to another aspect of the invention, depositing the resist material layer over the electrically insulating material layer and patterning the resist material layer can occur in the same process step.

According to another aspect of the invention, removing the exposed electrically insulating material layer to expose a portion of the electrically conductive material layer can include using a liquid etchant. In another aspect of the invention, when a liquid etchant is used to remove the exposed electrically insulating material layer, the same liquid etchant can be used to remove the exposed electrically conductive material layer to create a reentrant profile in the electrically conductive material layer.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art.

Figure 1:
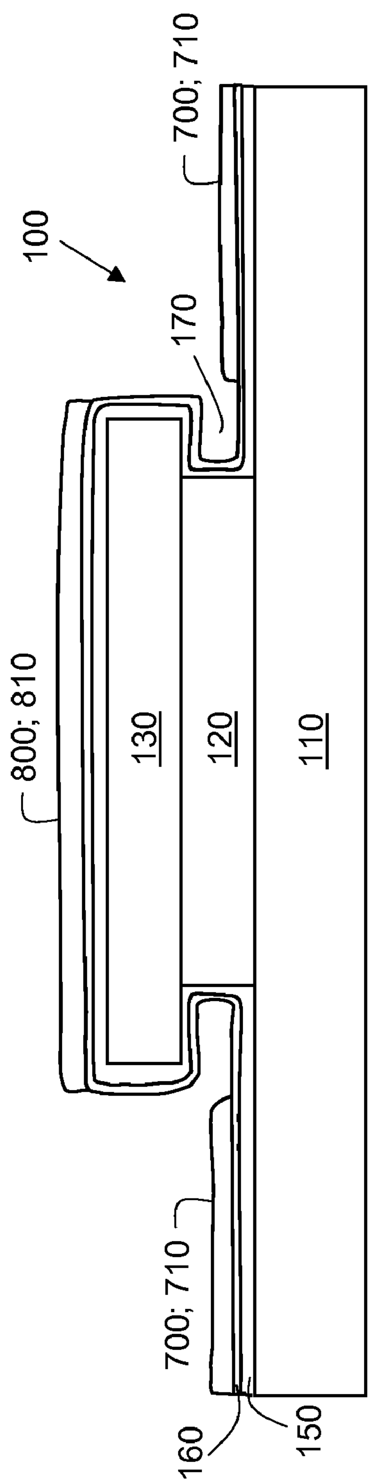
FIG. 1 is a schematic cross sectional view of a vertical transistor.

Referring to FIG. 1, a schematic cross sectional view of a vertical transistor 100 is shown. Transistor 100 includes a substrate 110, an (a first) electrically conductive material layer 120, and an (a first) electrically insulating material layer 130. Transistor 100 also includes another (a second) electrically insulating material layer 150, a semiconductor material layer 160, an electrode(s) 700, and an electrode 800.

Conductive layer 120 is positioned between substrate 110 and insulating layer 130. A first surface of conductive layer 120 contacts a first surface of substrate 110 while a second surface of conductive layer 120 contacts a first surface of insulating layer 130. Insulating material layer 130 is often referred to as a dielectric material layer. Substrate 110, often referred to as a support, can be rigid or flexible.

Insulating layer 130, conductive layer 120, substrate 100, or combinations thereof is appropriately dimensioned (or sized), positioned, or dimensioned and positioned relative to at least one other layer or substrate to create a reentrant profile 170 in transistor 100. As such, it can be said that at least a portion of one or more of insulating layer 130, conductive layer 120, substrate 100 defines the reentrant profile 170 of transistor 100. The reentrant profile 170 shields at least some of conductive layer 120 from material deposited (or coated) using a directional (or line of sight) deposition (or coating) process. The reentrant profile 170 allows at least some of the conductive layer 120 to be accessible to material deposited using a conformal deposition (or coating) process. For example, electrically insulating material layer 130 and electrically conductive material layer 120 can define the reentrant profile 170.

As shown in FIG. 1, the reentrant profile 170 is defined by portions of one or both of electrically insulating material layer 130 and electrically conductive material layer 120. Insulating layer 130 is sized and positioned to extend beyond conductive layer 120 such that insulating layer 130 creates a reentrant profile 170 relative to conductive layer 120. Alternatively stated, conductive layer 120 is sized and positioned to end (in both the left and right directions as shown in FIG. 1) before insulating layer 130 ends such that conductive layer 120 creates a reentrant profile 170 relative to insulating layer 130.

Insulating material layer 150 conforms to the reentrant profile 170 of transistor 100. Insulating material layer 150 includes first and second surfaces with the first surface being in contact with portions of surfaces of insulating layer 130, conductive layer 120, and substrate 110. Semiconductor material layer 160 conforms to the reentrant profile 170 of transistor 100. Semiconductor layer 160 includes first and second surfaces with the first surface being in contact with the second surface of insulating layer 150. Distinct (or separate, different) portions of the second surface of semiconductor layer 160 are in contact with electrode(s) 700 and electrode 800.

Electrode(s) 700 includes another (a second) electrically conductive material layer 710. Electrode 800 includes yet another (a third) electrically conductive material layer 810. Electrode(s) 700 and electrode 800 are positioned spaced apart from each other at different locations of transistor 100. The second and the third electrically conductive material layers 710, 810 can be the same material layer. When this is done, electrode(s) 700 and electrode 800 are included in distinct portions of the same electrically conductive material layer, either material layer 710 or material layer 810. Alternatively, the second and the third electrically conductive material layers 710, 810 can be distinct (different) material layers.

Conductive layer 120 functions as the gate of transistor 100. In some example embodiments of transistor 100, electrode(s) 700 functions as the drain of transistor 100 and electrode 800 functions as the source of transistor 100. In other example embodiments of transistor 100, electrode(s) 700 functions as the source and electrode 800 functions as the drain.

The semiconductor device is actuated in the following manner. After transistor 100 is provided, a voltage is applied between the second electrically conductive material layer 710 and the third electrically conductive material layer 810. A voltage is also applied to the first electrically conductive material layer 120 to electrically connect the second electrically conductive material layer 710 and the third electrically conductive material layer 810.

The reentrant profile 170 of transistor 100 allows a dimension of the semiconductor material channel of the transistor to be associated with the thickness of the conductive layer 120, which functions as the gate, of transistor 100. Advantageously, this architecture of the present invention reduces reliance on high resolution or very fine alignment features during the manufacture of transistors that include small channels.

Referring to FIGS. 2 through 8, schematic cross sectional views of process steps associated with an example embodiment of a method of manufacturing transistor 100 are shown.

Generally described, transistor 100 is fabricated in the following manner. A substrate 110 is provided including in order an electrically conductive material layer 120 and an electrically insulating material layer 130. A resist material layer 140 over electrically insulating material layer 130. Resist material layer 140 is patterned to expose a portion of electrically insulating material layer 130. The exposed portion of electrically insulating material layer 130 is removed to expose a portion of electrically conductive material layer 120. The exposed portion of electrically conductive material layer 120 is removed. Removal of conductive material layer 120 continues to create a reentrant profile 170. As shown in FIG. 1, the reentrant profile 170 is created by the removal of some of electrically conductive material layer 120 while some of electrically insulating material layer 130 remains. In this sense, it can be said that the reentrant profile 170 is created in conductive material layer 120 relative to electrically insulating material layer 130. After removal of photoresist layer 140, if such is necessary, substrate 110 and the remaining exposed material layers 120, 130 are conformally coated with a second electrically insulating material layer 150. Second electrically insulating material layer 150 is conformally coated with a semiconductor material layer 160. An electrically conductive material layer, either 710 or 810, or layers 710, 810 is directionally deposited over semiconductor material layer 160.

The resist material layer 140 can be deposited over electrically insulating material layer 130 and patterned in the same process step. A liquid etchant can be used to remove the exposed portion of the electrically insulating material layer 130 to expose a portion of the electrically conductive material layer 120. The same liquid etchant that is used to remove the exposed portion of the electrically insulating material layer 130 can be used to remove the exposed portion of the electrically conductive material layer 120 to create the reentrant profile 170 in the electrically conductive material layer 120.

In some example embodiments, substrate 110 can include more than one material layer. The additional material layer(s) is included in some instances to improve or maintain the structural integrity of substrate 110 during the manufacturing process. When substrate 110 includes more than one material layer, for example, a first layer and a second layer, the fabrication method can include removing the second layer of substrate 110.

Figure 2:
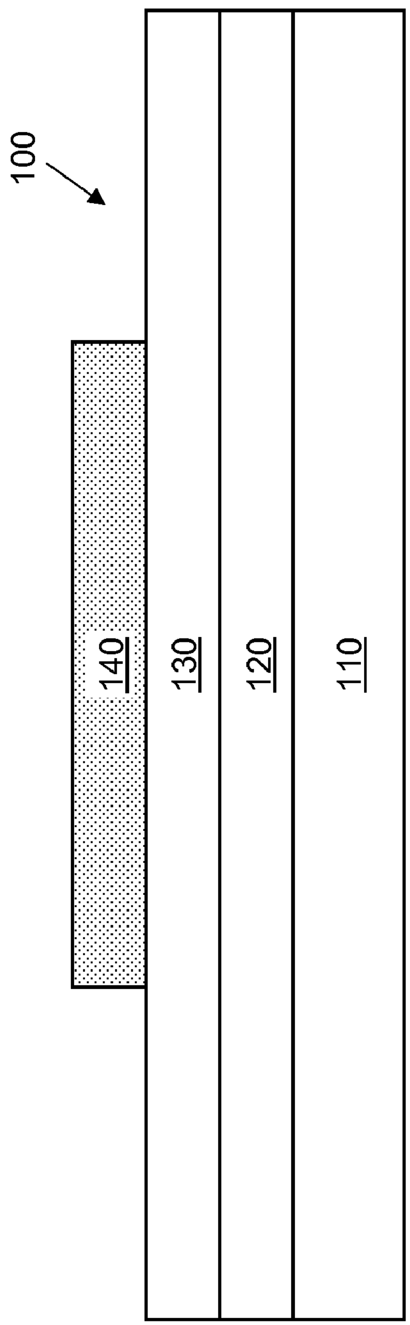
FIGS. 2 through 8 are schematic cross sectional views of process steps associated with an example embodiment of a method of manufacturing the vertical transistor shown in FIG. 1.

Referring back to FIG. 2, a schematic cross sectional view of transistor 100 material layers prior to material processing is shown. The manufacturing process for forming the vertical transistor device begins with a substrate 110 that is non-conductive, either in whole or in part with respect at least the portion of the substrate that is adjacent to conductive layer 120 (the top of the substrate 110 as shown in FIG. 2), such that electrical shorting of transistor 100 does not occur. Conductive layer 120 is applied to or deposited onto substrate 110. Conductive layer 200 functions as the gate of transistor 100 and by its thickness (in the vertical direction as shown in FIG. 2) defines a length of the gate by its thickness. A dielectric non-conductive layer 130 is applied to or coated on conductive layer 120. Non-conductive layer 130 is a uniform layer with no pattern. A resist layer 140 is applied to dielectric non-conductive layer 130. Resist 400 is patterned.

Substrate 110 does not interact appreciably with any of the layers or the processing methods. Substrate 110, often referred to as a support, can be used for supporting the thin film transistor (also referred to as a TFT) during manufacturing, testing, and/or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a “non-participating support” herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an insulating layer to electrically isolate the thin film transistor. If flexibility is not a concern, then the substrate can be a wafer or sheet made of materials including glass and silicon.

In some example embodiments, substrate 110 can include a temporary support or support layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be remove from the flexible polymeric support after completion of the manufacturing process.

The conductive layer 120, commonly referred to as a conductor, can be any suitable conductive material that permits conductive layer 120 to function as a gate. A variety of gate materials known in the art are also suitable, including metals, degenerately doped semiconductors, conducting polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used.

The gate electrode can be deposited on substrate 110 using chemical vapor deposition, sputtering, evaporation, doping, or solution processing. In some embodiments of the invention, the same material can provide the gate electrode function and also provide the support function of substrate 110 provided substrate 110 also includes an insulating layer to electrically isolate transistor 100. For example, doped silicon can function as the gate electrode and support the TFT.

The thickness (the vertical direction as shown in FIG. 2) of the gate electrode can vary, typically from about 100 to about 10000 nm. As the thickness defines the gate length, the thickness is usually thicker than twice the thickness of the conformally coated materials in order to reduce the likelihood of electrical shorting.

As shown in FIG. 2, nonconductive layer 130 is coated uniformly over the conductive layer 120. Examples materials suitable for use in nonconductive layer 130 include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for nonconductive layer 130, commonly referred to as the gate dielectric. Of these materials, aluminum oxides, silicon oxides, and zinc selenide are preferred. In addition, polymeric materials such as polyimides, polyvinyl alcohol, poly(4-vinylphenol), polyimide, and poly(vinylidene fluoride), polystyrene and substituted derivatives thereof, poly(vinyl naphthalene) and substituted derivatives, and poly(methyl methacrylate) can be used.

Nonconductive layer 130 is coated with a resist 400. Resist 400 is patterned. Resist 400 can be a conventional photoresist known in the art such as a polymeric positive acting resist or a negative resist. Resist 400 is exposed through a mask with a low resolution (>1 mm) alignment to substrate 110 and developed to yield a pattern of resist. In another example embodiment, the pattern of resist 400 is accomplished using a printing process, such as flexography or inkjet printing, that prints the resist directly in a patterned manner without using a mask.

Figure 3:
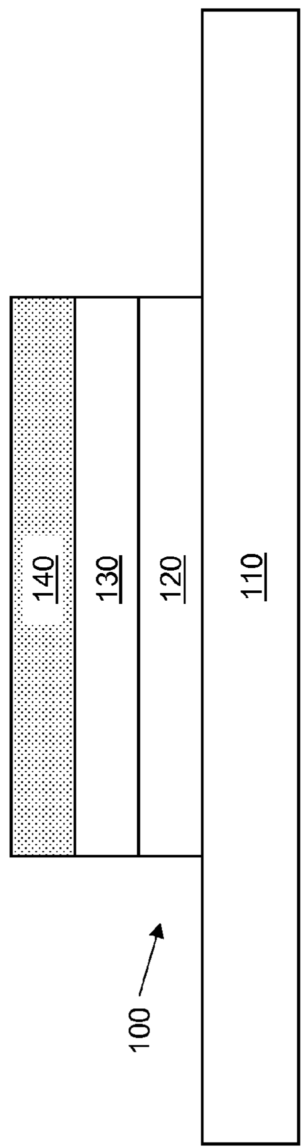

Referring back to FIGS. 3-5, a schematic cross sectional view of transistor 100 material layers during and after material processing are shown. In FIG. 3, nonconductive layer 130, commonly referred to as a nonconductor, is etched through patterned resist 400. The etchant can be any organic or inorganic material which removes the nonconductive material without substantial attacking resist 400 or the underlying conductor layer 120. Conductor 120 is then removed using a suitable etchant which removes the conductor 120 but has little impact on substrate 110 or the overlying nonconductor 130. As such, the selected etchant often depends on the substrate 110, the conductor, 120, or the nonconductor 130. Etchant interaction with resist 140 and loss of the resist 140 at this point is usually of little consequence, since the nonconductor 130 now acts as a mask. As shown in FIG. 3, the etching process or processes used etch away portions of conductor 120 and nonconductor 130 such that conductor 120 and nonconductor 130 have the same pattern.

Figure 4:
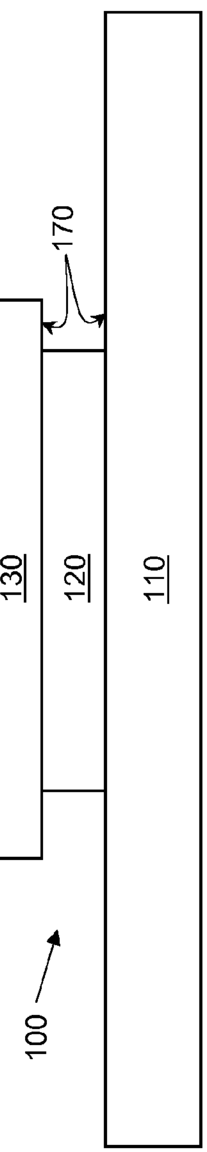

As shown in FIG. 4, selective etching of conductor 120 is continued until the reentrant profile 170 shown in FIG. 4 is formed. When etching of conductor 120 is complete, nonconductor 130 overhangs conductor 120 which creates a reentrant profile 170 that is sufficient to shield at least some of the underlying surface (of either conductor 120 or substrate 110) from coating by a directional (or line-of-sight) coating source positioned above (as shown in FIG. 4) substrate 110. Alternatively stated, conductor 120 underhangs nonconductor 130. The remaining conductor 120 acts as the gate conductor when the semiconductor device is complete.

Figure 5:
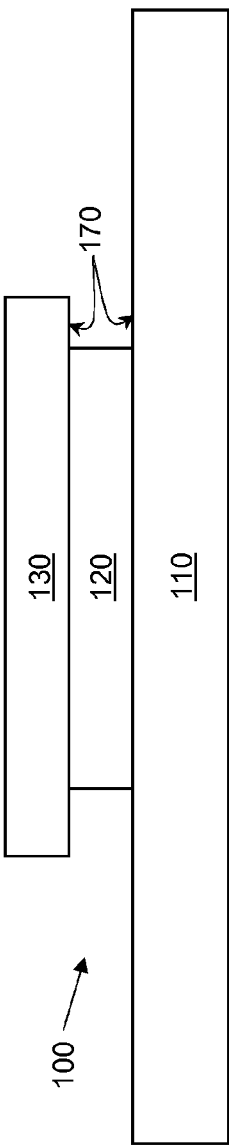

At this point, if it is necessary, resist 140 is removed. Gentle cleaning can be performed on the material layer stack, if desired, provided that the cleaning process does not remove the reentrant profile 170. FIG. 5 shows a cross sectional view of the semiconductor device after the reentrant profile 170 has been created and after resist has been removed.

Figure 6:
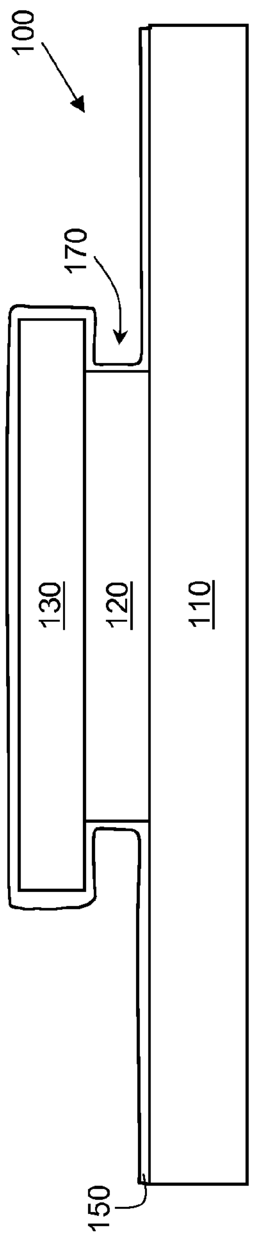

Referring back to FIGS. 6 and 7, schematic cross sectional views of the semi-conductor device after conformal coating of a dielectric nonconductive material, often referred to as an insulator, and a semiconductor material, respectively, are shown. In FIG. 6, a dielectric nonconductive material 150 is then conformally coated using a conformal coating deposition process over substrate 110 and the topographic feature formed by material layers 120 and 130. Applying nonconductive material 150 using a conformal coating process helps to maintain the reentrant profile 170. Nonconductive material 150 is often referred to as the gate dielectric. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

Figure 7:
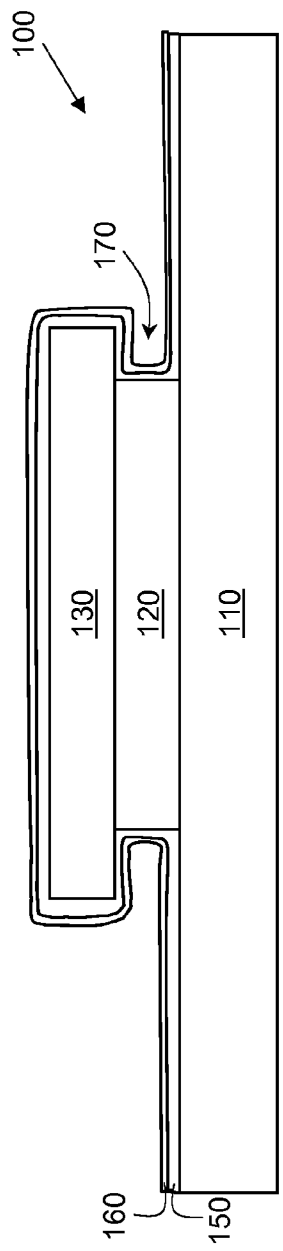
Figure 8:
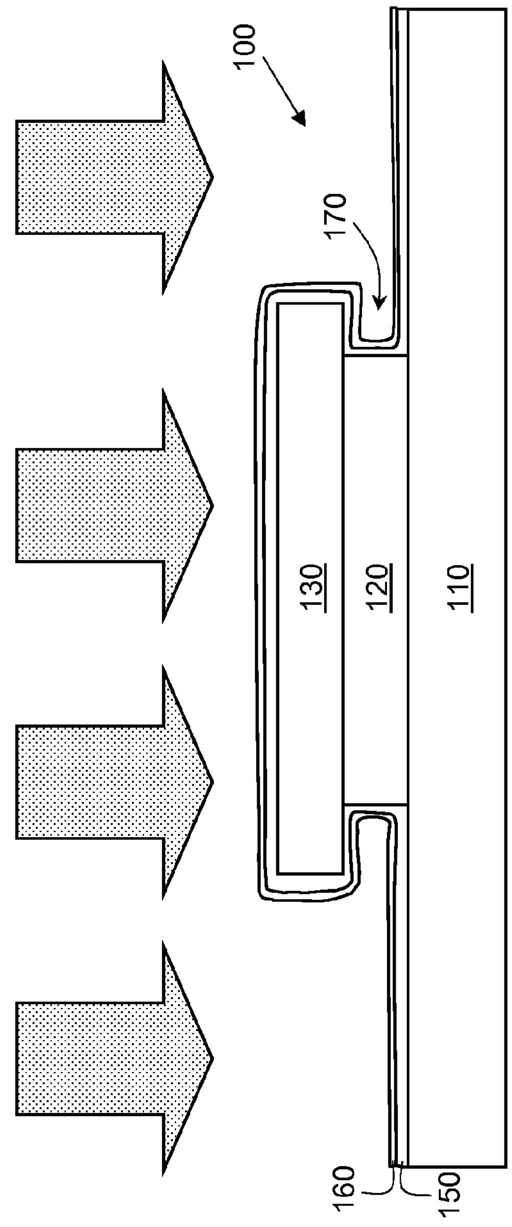

In FIG. 7, a semiconductor material 160 is then coated using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrode 700 and 800 when gate 120 is energized, it is important that the conformally coated material be provided with a consistent or uniform thickness at least in the region where the reentrant profile 170 and the gate are located and more preferable in the areas between electrode(s) 700 and electrode 800 including the area where the reentrant profile 170 and the gate are located. A preferred process for conformally coating is atomic layer deposition (ALE)) or one of its various derivatives such as spatial ALD (S-ALD). This process yields a uniform thickness on a highly varying topology. ALD and S-ALD are discussed in more detail below.

The semiconductor material layer 160, often referred to as a semiconductor, can be any type of semiconductor provided the semiconductor material can be deposited or coated using a conformal coating process such as ALD. Examples of suitable semiconductor materials include zinc oxide, zinc chalcogenides, cadmium chalcogenides, gallium pnictides, aluminum nictides, or silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor layer has been applied using a process such as ion implantation and thermal diffusion.

Referring back to FIG. 8, a schematic cross sectional view of the semi-conductor device during directional coating of an electrically conductive material is shown. After semiconductor layer 160 has been deposited, the source and drain electrode(s) 700 and electrode 800 are deposited using a directional (or line-of-sight) deposition process which does not deposit or coat material into the reentrant profile 170. Examples of suitable directional deposition processes include thermal evaporation, electron beam evaporation, sputtering, or laser ablation. The active channel gap between electrode(s) 700 and electrode 800 is maintained by the shadow casted by the overhang of nonconductive layer 130 relative to conductive material layer 120.

Referring back to FIG. 1, transistor 100 after electrode(s) 700 and electrode 800 have been deposited is shown. The drain and the source of transistor 100 can be selected from either of electrode 700 and electrode 800 with the selection typically being based on the application and the characteristics of the contemplated device. As shown in FIG. 1, electrode 800 is on the top of the mesa formed by nonconductor 130 and conductor 120 while electrode(s) 700 is not. As such, electrode 700 and electrode 800 are on different planes. Any necessary interconnects can be accomplished using conventional techniques, for example, layer leveling and via feed through, well known in the art.

Substrate 110, conductive layer 120, nonconductive layer 130, nonconductive layer 150, semiconductor layer 160, or combinations thereof can include one or more layers provided the functional aspect of the layer remains unchanged. Additional layers, for example, leveling layers, barrier layers, adhesion layer, can be included in the semiconductor device as long as the function of the layers described above is preserved.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials, commonly referred to a precursors, in a vacuum chamber. A first precursor is applied to react with the substrate. The excess of the first precursor is removed is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, US 2008/0166884, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is compatible with a low temperature coating environment and provides the ability to use higher mobility materials when compared to other coating techniques. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

Experimental Results

A 600 nm layer of chromium was deposited via sputtering on a 62.5 mm square silicon substrate coated by a thermal oxide layer. On top of this, a 120 nm aluminum oxide layer was coated at 200 degrees Celsius using the S-ALD process described in U.S. Pat. No. 7,413,982 and the S-ALD apparatus described in U.S. Pat. No. 7,456,429 with the organometallic precursors trimethyl aluminum and water with an inert carrier gas of nitrogen.

A patterned layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 70 seconds on a Cobilt mask aligner (Cobilt model CA-419 from Computervision Corporation, Sunnyvale, Calif.), using only the edges of the silicon substrate as a low resolution or crude alignment. The sample was then developed for 60 seconds in Microposit MF-319 developer (Rohm and Haas Electronic Materials LLC, Marlborough, Mass.) and rinsed for 5 minutes in DI water.

The nonconductive aluminum oxide was etched at 60 degrees Celsius with concentrated phosphoric acid for 6.5 minutes. The chromium was etched using a chromium etch including a 0.6 M solution of ceric ammonium chloride with 8% acetic acid. The exposed chromium was etched visibly through in 13.3 minutes. Undercut etching was accomplished via 2 minutes of continued etching. The substrate was then rinsed in DI water for 5 minutes, rinsed with acetone to remove the photo resist, then rinsed in HPLC grade isopropanol, and then allowed to dry.

The substrate was then coated as described above with an additional layer 120 nm thick of aluminum oxide conformally using the S-ALD apparatus and process. The substrate was then coated with a 25 nm layer of zinc oxide using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 70 nm thick.

Figure 9:
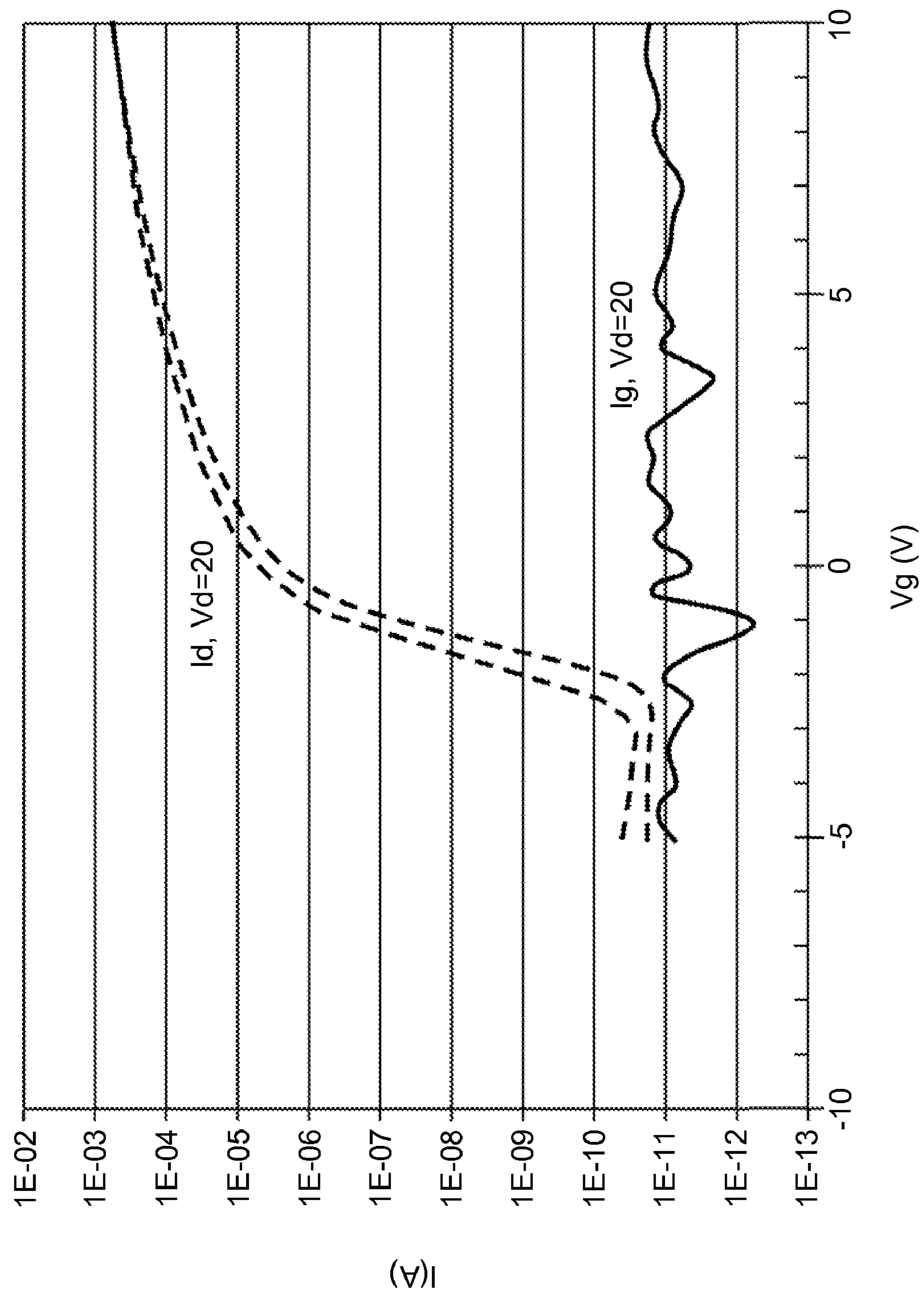
FIG. 9 is a graph showing performance transfer characteristics for the vertical transistor shown in FIG. 1.
Figure 10:
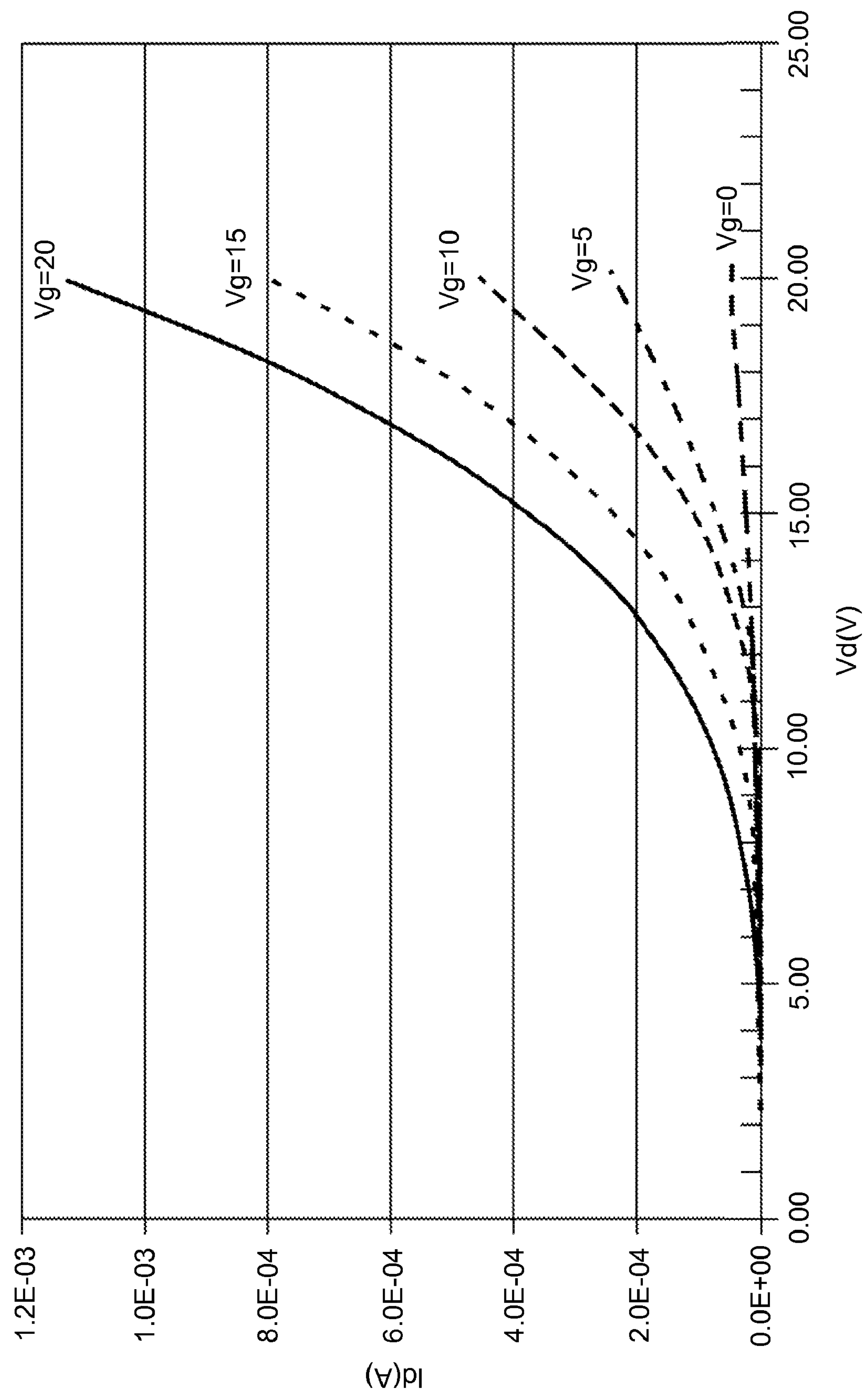
FIG. 10 is a graph showing performance $I_d$-$V_d$ curve characteristics for the vertical transistor shown in FIG. 1.

Testing of the transistor was accomplished by using a probe station to contact the aluminum on top of the line, the aluminum on one side of the line and the chromium gate metal which acts as the gate. Referring to FIG. 9, a graph showing performance transfer characteristics for the transistor is shown. As can be seen in FIG. 9, the drain current versus gate voltage is constant at a drain voltage of 20 volts. The gate current which has very little leakage at all gate voltages is also shown. It can also be seen that the drain current responds well to the gate voltage, ranging from a small current of about $10^{-11}$ amps at a gate of −2 volts to almost a milliamp at a gate of 10 volts. Referring to FIG. 10, a graph showing performance $I_d$-$V_d$ curve characteristics for the transistor is shown. As can be seen in FIG. 10, the drain current versus drain voltage is very responsive to the gate voltage. Test results of the devices also show a respectable on/off of greater than $10^7$ for a drain voltage of 20 V and gate voltage of 10V.

The invention has been described in detail with particular reference to certain preferred embodiments thereof, but it will be understood that variations and modifications can be effected within the scope of the invention.

PARTS LIST

100 transistor
110 substrate
120 conductor
130 nonconductor
140 resist
150 gate dielectric
160 semiconductor
170 reentrant profile
700 electrode
710 second electrically conductive material layer
800 electrode
810 third electrically conductive material layer

The invention claimed is:

1. A method of manufacturing a transistor comprising:

providing a substrate including in order an electrically conductive material layer and an electrically insulating material layer;

depositing a resist material layer over the electrically insulating material layer;

patterning the resist material layer to expose a portion of the electrically insulating material layer;

removing the exposed electrically insulating material layer to expose a portion of the electrically conductive material layer;

removing the exposed electrically conductive material layer to create a reentrant profile in the electrically conductive material layer and the electrically insulating material layer;

conformally coating the substrate and the exposed material layers with a second electrically insulating material layer;

conformally coating the second electrically insulating material layer with a semiconductor material layer; and directionally depositing an electrically conductive material layer over the semiconductor material layer.

2. The method of claim 1, wherein depositing the resist material layer over the electrically insulating material layer and patterning the resist material layer occur in the same process step.

3. The method of claim 1, wherein removing the exposed electrically insulating material layer to expose a portion of the electrically conductive material layer includes using a liquid etchant.

4. The method of claim 3, wherein removing the exposed electrically conductive material layer to create a reentrant profile in the electrically conductive material layer includes using the same liquid etchant that is used to remove the exposed electrically insulating material layer.

5. The method of claim 1, the substrate including a first layer and a second layer, the method further comprising:

removing the second layer of the substrate.

* * * * *